US012013451B2

United States Patent
Arberet et al.

(10) Patent No.: US 12,013,451 B2
(45) Date of Patent: Jun. 18, 2024

(54) NOISE ADAPTIVE DATA CONSISTENCY IN DEEP LEARNING IMAGE RECONSTRUCTION VIA NORM BALL PROJECTION

(71) Applicant: Siemens Healthineers AG, Forchheim (DE)

(72) Inventors: Simon Arberet, Princeton, NJ (US); Boris Mailhe, Plainsboro, NJ (US); Marcel Dominik Nickel, Herzogenaurach (DE); Thomas Benkert, Neunkirchen am Brand (DE); Mahmoud Mostapha, Princeton, NJ (US); Mariappan S. Nadar, Plainsboro, NJ (US)

(73) Assignee: Siemens Healthineers AG, Forchheim (DE)

( * ) Notice: Subject to any disclaimer, the term of this patent is extended or adjusted under 35 U.S.C. 154(b) by 116 days.

(21) Appl. No.: 17/929,803

(22) Filed: Sep. 6, 2022

(65) Prior Publication Data

US 2024/0077561 A1    Mar. 7, 2024

(51) Int. Cl.
*G01R 33/48*      (2006.01)
*G01R 33/54*      (2006.01)
*G01R 33/565*     (2006.01)

(52) U.S. Cl.
CPC ....... *G01R 33/4818* (2013.01); *G01R 33/546* (2013.01); *G01R 33/565* (2013.01)

(58) Field of Classification Search
CPC . G01R 33/4818; G01R 33/546; G01R 33/565
See application file for complete search history.

(56) References Cited

U.S. PATENT DOCUMENTS

| | | | |
|---|---|---|---|
| 2015/0126850 A1* | 5/2015 | Cetingul | G01R 33/20 |
| | | | 324/309 |
| 2020/0103483 A1* | 4/2020 | Hardy | G01R 33/5608 |
| 2020/0289019 A1* | 9/2020 | Schlemper | A61B 5/055 |
| 2022/0215600 A1 | 7/2022 | Arberet et al. | |
| 2023/0274418 A1* | 8/2023 | Arberet | G16H 30/40 |
| | | | 382/128 |
| 2024/0036138 A1* | 2/2024 | Arberet | G06F 18/214 |

OTHER PUBLICATIONS

Antun, Vegard, et al. "On instabilities of deep learning in image reconstruction—Does AI come at a cost?." arXiv preprint arXiv:1902.05300 (2019).
Zhu, Bo, et al. "Image reconstruction by domain-transform manifold learning." Nature 555.7697 (2018): 487-492.

* cited by examiner

*Primary Examiner* — G.M. A Hyder

(57) ABSTRACT

A computer-implemented method includes, based on scan data defining an input image, determining a reconstructed image using a reconstruction algorithm, and executing a data consistency operation for enforcing consistency between the input image and the reconstructed image. The data consistency operation includes using a norm ball projection that takes into account the available noise level information in order to automatically adjust the balance between the network prediction and the input measurements.

20 Claims, 4 Drawing Sheets

NOISE ADAPTIVE DATA CONSISTENCY IN DEEP LEARNING IMAGE RECONSTRUCTION VIA NORM BALL PROJECTION

FIELD

This disclosure relates to image reconstruction, such as reconstruction in magnetic resonance (MR) imaging.

BACKGROUND

Image reconstruction is used for various applications. For example, some types of medical imaging perform reconstruction for imaging, such as MR, computed tomography (CT), positron emission tomography (PET), or single photon emission computed tomography (SPECT). Reconstruction may include increasing an image resolution and reducing artifacts or noise included in an image among other goals. Image reconstruction may also be used for post-processing microscopy images or video editing.

Various reconstruction algorithms are known. One example of a reconstruction algorithm employs machine learning (deep learning). Machine-learned reconstruction algorithms often show improved image quality compared to traditional reconstruction techniques, however, one of the limitations is a risk of hallucinating structures, or other stability issues such as, for example, an unpredicted behavior when an input is vastly different from what a machine learned network has been trained on. This may be a special concern for medical image applications as lower quality reconstructions may lead to poor quality diagnosis.

In order to mitigate the stability issue in deep learning image reconstruction, unrolled network architectures that incorporate data consistency steps and regularization steps may be preferred compared to black box networks as unrolled network architectures have shown better stability than black-box networks. The use of unrolled network architectures in medical imaging also allows the use of a hard data consistency (DC) operation that forces an output of the network to be fully consistent with an input of the network by, for example, simply replacing the k-space coefficients of the last layer with the raw measurements. The main advantage of the hard DC operation is an improved stability and robustness guaranty. However, one important drawback of the hard DC operation is that it doesn't take into account the noise level of the raw measurement. In particular, if the measurement data is very noisy, then the noisy measurements are copied to the network output. This leads to reduced denoising capabilities and potentially to a low signal to noise ratio (SNR) output.

SUMMARY

By way of introduction, the preferred embodiments described below include methods, systems, instructions, and computer readable media for image reconstruction using a norm ball projection to enforce data consistency.

In a first aspect, a method for image reconstruction, the method comprising: acquiring scan data defining an input image, wherein the scan data includes noise level information; generating a reconstructed image from the scan data using a reconstruction network comprising at least a data consistency operation that enforces data consistency by using a norm ball projection that adjusts a balance between a reconstruction network prediction and the scan data based on at least the noise level information; and outputting the reconstructed image.

In an embodiment, the noise level information comprises a standard deviation of noise and wherein the norm ball projection uses a norm ball with a radius that is proportional to the standard deviation of noise. The radius may correspond to a weighting parameter multiplied by the standard deviation of noise. The weighting parameter may be a trainable parameter that is determined during training of the reconstruction network.

In an embodiment, the data consistency operation merges, for each one of multiple respective K-space positions, a further respective K-space value provided by the reconstruction network by the respective K-space value associated with the scan data. The data consistency operation enforces data consistency by transforming an input of a data consistency layer and projects a coefficient for which there is a corresponding measurement available onto a norm ball centered on the coefficient.

In an embodiment, the reconstruction network comprises a machine-learned neural network, wherein the machine-learned neural network is trained end-to-end including a data consistency layer that implements the data consistency operation.

The norm ball projection uses an L2 norm ball or an L∞ norm ball.

The scan data comprises k-space data, wherein the norm ball projection is implemented in a sequence of gradient or modified gradient steps.

In an embodiment, the scan data comprises image data, wherein the method further comprises transforming the input image into K-space to obtain a K-space representation of the input image. K-space values are selected from the K-space representation of the input image within a mask limited to K-space positions natively defined by the scan data.

In an embodiment, the reconstruction network comprises an iterative optimization, the iterative optimization comprising multiple iterations, wherein the data consistency operation is executed for each iteration of the multiple iterations.

In a second aspect, a system is provided for image reconstruction. The system includes a medical scanner, a reconstruction network, and a display. The medical scanner is configured to scan a region of a patient, the scan providing scan data including a level of noise for the scan data. The reconstruction network comprises a data consistency layer configured to enforce data consistency using a norm ball projection, the reconstruction network configured to output a representation of the scan data. The display is configured to display the representation of the scan data.

In an embodiment, the norm ball projection uses a norm ball with a radius that is proportional to a standard deviation of noise of the scan data. The radius corresponds to a weighting parameter multiplied by the standard deviation of noise. The weighting parameter is a trainable parameter that is determined during training of the reconstruction network. The norm ball projection uses a L2 or L∞ norm ball.

In a third aspect, a method for training a network for image reconstruction is provided. The method includes acquiring a training set of scan data, machine training the network for image reconstruction using the training data, the network at least comprising a data consistency layer configured to enforce data consistency using a norm ball projection, and storing the machine trained network.

In an embodiment, a radius of a norm ball for the norm ball projection is equal to a weighting parameter multiplied by a standard deviation of noise of the scan data. The weighting parameter is determined during the machine training of the network.

The present invention is defined by the following claims, and nothing in this section should be taken as a limitation on those claims. Further aspects and advantages of the invention are discussed below in conjunction with the preferred embodiments and may be later claimed independently or in combination.

DETAILED DESCRIPTION

Figure 1:
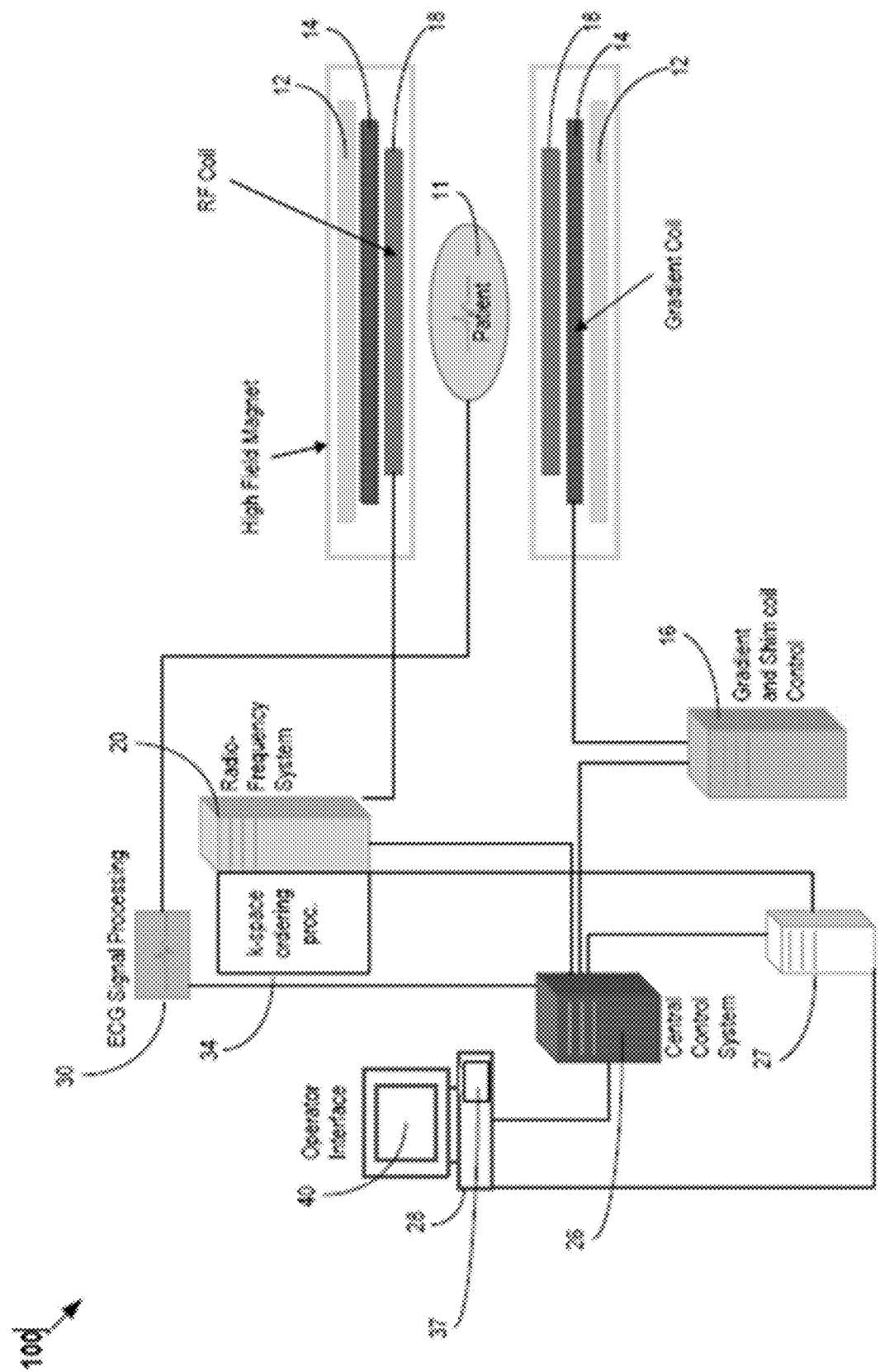
FIG. 1 depicts an embodiment of a system for acquiring scan data and image reconstruction for a medical imaging procedure.

Embodiments described herein provide systems and methods for data consistency using a norm ball projection, referred to herein as norm ball DC projection. The norm ball DC projection exploits the information of a standard deviation of the noise of the input data set. Instead of a hard DC projection, the norm ball DC projection is more adaptable by taking into account a level of noise of the k-space measurements. If the noise level is low, the measurements are more reliable than if the noise level is high, and thus a higher weight on the raw measurements may be used when the output is merged with the network predictions.

In an example, using the norm ball DC projection, if a standard deviation of the scan data is zero, i.e., there is no noise in the measurements and the norm ball DC projection behaves similar to a hard DC operation, i.e., the raw measurements are replaced by the corresponding coefficients coming from the network. In the other extreme, if the standard deviation is very large, then the norm ball DC projection by-passes the signal, i.e., acts as if there was no hard DC operation. In between these extremes, the norm ball DC projection provides data consistency that is adjustable based on the level of noise of the k-space measurements, thereby providing a more accurate image representation.

In an embodiment, the norm ball DC projection is implemented using a layer at the end of a reconstruction network that transforms the input of that layer in the k-space domain and projects the coefficients for which there is a corresponding measurement available onto a norm ball centered on that raw measurement coefficient. The radius of that norm ball is proportional to the standard deviation of the noise, and thus if the standard deviation is equal to zero, the norm ball DC projection performs similar to the hard DC operation described above. If the standard deviation is large, the projection will either do nothing if the network prediction and the raw measurement coefficient are close enough (point inside the ball), or the network coefficient will be pushed toward the measurement coefficient (point outside the ball) until it reaches the ball. After this projection in the k-space domain, the result is transformed back to the image domain using an adjoint operator (Fourier transform and SENSE or RSS).

Embodiments provide a norm ball DC projection that takes into account the available noise level information in order to automatically adjust the balance between the network prediction and the input measurements. As a consequence, it provides an output with more uniform SNR across data with various input SNR.

Various examples of the disclosure generally relate to image reconstruction. Scan data is obtained from a device or from a memory and then a reconstruction process is performed. As a general rule, the techniques described herein may be applicable to various image reconstruction tasks. For instance, image reconstruction of medical images, e.g., MRI image or computer tomography (CT) images is a primary application and used in the examples below. Other uses may be contemplated, such as where microscopy images are reconstructed, e.g., to achieve super resolution and/or remove artifacts. Photography may be reconstructed, e.g., to remove flares. X-ray images may be reconstructed, e.g., to make certain structures otherwise hidden visible.

FIG. 1 depicts an embodiment of a system 100 for acquiring scan data and image reconstruction for a medical imaging procedure. The system 100 is described below in general, with a following method providing other details. The system 100 implements the method of FIG. 2, 3, 4, or other instructions. The example used herein is for reconstruction in a MR context (i.e., a MR scanner), but other types of scanners may be used (e.g., reconstruction for CT, PET, SPECT, or other medical imaging method). The system 100 is implemented by an MR scanner or system, a computer based on data obtained by MR scanning, a server, or another processor. The MR scanning system 100 is only exemplary, and a variety of MR scanning systems may be used to collect the MR data.

The system 100 is configured to scan a patient 11 using a medical scanner. The term medical scanner may refer to the entire imaging system or only a portion of the system 100. The scan provides scan data. Alternatively, the scan data may be obtained from a data storage, for example from a previously performed imaging procedure. The scan data may include source data. The source data may be implemented by K-space data samples or by image-domain pixels or voxels. The scan data defines an input image. According to some examples, the scan data may include the input image. For example, the scan data may be defined in spatial domain. For instance, an optical microscope may be used to obtain the input image. According to further examples, the scan data may be defined in K-space. Examples would include acquisition of an MRI measurement dataset. Here, a Fourier transformation is required to obtain the input image from the scan data. Example scan data include source data such as raw measurement in an MRI K-space-to-image reconstruction, or, e.g., a low-resolution image in the case of a super-resolution image-to-image reconstruction.

In an embodiment, the system 100 scans a patient 11 to provide k-space measurements (measurements in the frequency domain). As described herein, the imaging protocol implemented by the scanner includes acquiring multiple repetitions or directions. In the system 100, magnetic coils 12 create a static base magnetic field in the body of patient 11 to be positioned on a table and imaged. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generate magnetic field pulse sequences.

RF (radio frequency) module 20 provides RF pulse signals to RF coil 18, which in response produces magnetic field pulses that rotate the spins of the protons in the imaged body of the patient 11 by ninety degrees, by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The RF coil 18 may be a whole-body coil or may be formed from one or more local coils, at least on receive. The MR signals are detected and processed by a detector within RF module 20 and k-space component processor unit 34 to provide an MR dataset to an image data processor for processing into an image (i.e., for reconstruction in the object domain from the k-space data in the scan domain). In some embodiments, the image processor is in or is the central control unit 26. In other embodiments, such as the one depicted in FIG. 1, the image processor is in a separate unit 27. ECG synchronization signal generator 30 provides ECG signals used for pulse sequence and imaging synchronization. A two- or three-dimensional k-space storage array of individual data elements in k-space component processor unit 34 stores corresponding individual frequency components forming an MR dataset. The k-space array of individual data elements has a designated center, and individual data elements individually have a radius to the designated center.

A magnetic field generator (including coils 12, 14, and 18) generates a magnetic field for use in acquiring multiple individual frequency components corresponding to individual data elements in the storage array. A storage processor in the k-space component processor unit 34 stores individual frequency components acquired using the magnetic field in corresponding individual data elements in the array. The row and/or column of corresponding individual data elements alternately increases and decreases as multiple sequential individual frequency components are acquired. The magnetic field acquires individual frequency components in an order corresponding to a sequence of substantially adjacent individual data elements in the array, and magnetic field gradient change between successively acquired frequency components is substantially minimized.

The central control unit 26 uses information stored in an internal database to process the detected MR signals in a coordinated manner to generate high quality images of a selected slice(s) of the body (e.g., using the image data processor) and adjusts other parameters of the system 100. The stored information includes a predetermined pulse sequence of an imaging protocol and a magnetic field gradient and strength data as well as data indicating timing, orientation, and spatial volume of gradient magnetic fields to be applied in imaging.

The system 100 is configured to use the imaging protocol to scan a region of a patient 11. For example, in MR, such protocols for scanning a patient 11 for a given examination or appointment include diffusion-weighted imaging (acquisition of multiple b-values, averages, and/or diffusion directions), turbo-spin-echo imaging (acquisition of multiple averages), or contrast. In one embodiment, the protocol is for compressed sensing. The k-space is under sampled for more rapid scanning of the patient 11. The reconstruction may still reconstruct a representation in the object domain from the under sampled k-space data, but the representation may be more likely to suffer from noise. In another embodiment, parallel imaging is used. Multiple local coils are used to receive the data, providing additional information for reconstruction. In yet another embodiment, the protocol is for parallel imaging with compressed sensing.

The system 100 is configured to provide a level of noise or standard deviation of noise for the scan data that is generated. Noise is inevitably caused by scattering rays, quantum noise, and detectors. The noise level may depend on the specific acquisition parameters, total attenuation of the scan subject, absolute density of the tissue of interest, and on the location in the scanner bore, among other factors. Methods for calculating the level or noise may include, for example, a region of interest method, averaging multiple regions, or using machine learning tools. Alternative or other known methods or processes may be used. The system 100 may provide this value or level to the operator. The system 100 may use this value or level when performing the norm ball DC operation.

The system 100 includes an operator interface 40, formed by an input and an output. The input may be an interface, such as interfacing with a computer network, memory, database, medical image storage, or other source of input data. The input may be a user input device, such as a mouse, trackpad, keyboard, roller ball, touch pad, touch screen, or another apparatus for receiving user input. The input may receive a scan protocol, imaging protocol, or scan parameters. An individual may select the input, such as manually or physically entering a value. Previously used values or parameters may be input from the interface. Default, institution, facility, or group set levels may be input, such as from memory to the interface.

The output is a display device but may be an interface. The images reconstructed from the scan are displayed. For example, an image of a region of the patient 11 is displayed. A generated image of the reconstructed representation for a given patient 11 is presented on a display of the operator interface 40. The display is a CRT, LCD, plasma, projector, printer, or other display device. The display is configured to display the reconstructed MR image of the region of the patient 11. The computer 28 of the operator interface forms a graphical user interface (GUI) enabling user interaction with the central control unit 26 and enables user modification in substantially real time. The display processor 37 processes the magnetic resonance signals to provide image representative data for display on a display device, for example.

The central control unit 26 (i.e., controller) and/or processor 27 is an image processor that reconstructs a representation of the patient 11 from the scan data. The image processor is a general processor, digital signal processor, three-dimensional data processor, graphics processing unit, application specific integrated circuit, field programmable gate array, artificial intelligence processor, digital circuit, analog circuit, combinations thereof, or another now known or later developed device for reconstruction. The image processor is a single device, a plurality of devices, or a network. For more than one device, parallel or sequential division of processing may be used. Different devices making up the image processor 27 may perform different functions, such as reconstructing by one device and volume rendering by another device. In one embodiment, the image processor is a control processor or other processor of the system 100. Other image processors of the system 100 or external to the system 100 may be used. The image processor 27 is configured by software, firmware, and/or hardware to reconstruct. The instructions for implementing the processes, methods, and/or techniques discussed herein are provided on non-transitory computer-readable storage media or memories, such as a cache, buffer, RAM, removable media, hard drive, or other computer readable storage media. The instructions are executable by the processor or another processor. Computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the instructions set, storage media, processor or processing strategy and may be performed by software, hardware, integrated circuits, firmware, micro code, and the like, operating alone or in combination. In one embodiment, the instructions are stored on a removable media device for reading by local or remote systems. In other embodiments, the instructions are stored in a remote location for transfer through a computer network. In yet other embodiments, the instructions are stored within a given computer, CPU, GPU, or system. Because some of the constituent system components and method steps depicted in the accompanying figures may be implemented in software, the actual connections between the system components (or the process steps) may differ depending upon the manner in which the present embodiments are programmed.

The image processor 27 is configured to reconstruct a representation of a scan region, such as a region of the patient 11. The image processor 27 is configured to reconstruct a representation in an object domain. The representation or object in the object domain is reconstructed from the scan data in the scan domain. The scan data may be a set or a frame of k-space data from a scan of the patient 11. The scan data may be in the object domain. The object domain is an image space and corresponds to the spatial distribution of the patient 11. A planar or volume representation or object is reconstructed as an image representing the patient 11. For example, pixels values representing tissue in an area or voxel values representing tissue distributed in a volume are generated.

A manually parameterized reconstruction algorithm may be used. For instance, such reconstruction algorithm may rely on operations such as interpolation, edge sharpening, contrast enhancement, low-/high-pass filtering, blurring operations, etc. to name just a few options. The data consistency operation can be sequentially applied, after the reconstruction algorithm.

In embodiments, the reconstruction is performed, at least in part, using a machine-learned model or algorithm. The machine-learned model may include one or more networks and/or other machine-learned arrangements (e.g., support vector machine). For an example used herein, the machine-learned model includes one or more deep-learned neural networks included in an unrolled iterative reconstruction algorithm. A machine-learned model is used for at least part of the reconstruction, such as regularization of reconstruction. In regularization, image or object domain data is input and image or object domain data with less artifact is output. The remaining portions or stages of the reconstruction (e.g., Fourier transform and gradients in iterative optimization) are performed using reconstruction algorithms and/or other machine-learned networks. In an embodiment, a data consistency operation is performed for one or more iterations or as a final step/layer. For example, if the reconstruction algorithm is implemented as a multi-layer deep neural network, it would be possible that one or more layers towards the output layer or even the output layer itself implement the data consistency operation. The data consistency operation transforms the input in the k-space domain and projects the coefficients for which there is a corresponding measurement available onto a norm ball centered on that raw measurement coefficient. The radius of the norm ball is proportional to the standard deviation of the noise. If the standard deviation is large, then the projection will either do nothing if the network prediction and the raw measurement coefficient are close enough (point inside the ball), or the network coefficient will be pushed toward the measurement coefficient (point outside the ball) until it reaches the ball. After this projection in the k-space domain, the result is transformed back to the image domain using the adjoint operator (Fourier transform and SENSE or RSS).

For example, the following implementation may be used for a multi-layer deep neural network. A layer at the end of the multi-layer deep neural network may be added to implement the data consistency operation. The data consistency operation layer may transform the input of that layer into K-space and then replace all the values at those K-space positions for which there is a corresponding source data available in the scan data being input into the input layer of the multi-layer deep neural network. Such a source data may be natively defined in K-space. It would also be possible to determine the K-space representation of the input image to determine these values. In either case, a skip connection from the input of the multi-layer deep neural network to the data consistency operation layer may be implemented. After replacing all the values at those K-space positions at which corresponding source data is available, the data consistency operation layer transforms the result of this operation back to the image domain. During a training phase, weights of each layer of the neural network may be set. During the training phase, it would be possible to rely on ground truth data defining a reference reconstructed image of high quality. For instance, it would be possible to obtain the input image by artificially down sampling or otherwise preprocessing the reference reconstructed image. Noise or artifacts may be synthesized.

A machine-learned model may be used for all the reconstruction operations (one model to input k-space data and output regularized image data) or other reconstruction operations (e.g., used for transform, gradient operation, and/or regularization). The machine-learned model including the data consistency operation may be trained end to end. Machine learning is an offline training phase where the goal is to identify an optimal set of values of learnable parameters of the network that can be applied to different inputs. These machine-learned parameters can subsequently be used during clinical operation. Once learned, the machine-learned network is used in an online processing phase in which a reconstruction is performed for an imaging procedure after scan data is acquired for a given patient 11. A computer (e.g., the image processor 27) machine trains the network. The network is machine trained using training data including many sets of data, such as representations output by a supervised reconstruction process and a corresponding ground truth. Tens, hundreds, or thousands of samples are acquired, such as from scans of volunteers or patients, scans of phantoms, simulation of scanning, and/or by image processing to create further samples. Many examples that may result from different scan settings, patient anatomy, scanner characteristics, or other variance that results in different samples are used. Different levels of noise may be provided. The level of noise/standard deviation may be provided with the training data in the case where the norm ball DC operation is trained end to end with the rest of the network(s). In one embodiment, an already gathered or created MR dataset is used for the training data. The samples are used in machine learning (e.g., deep learning) to determine the values of the learnable variables (e.g., values for convolution kernels) that produce outputs with minimized cost or loss across the variance of the different samples. The training learns both the features of the input data and the conversion of those features to the desired output. Backpropagation, RMSprop, ADAM, or another optimization is used in learning the values of the learnable parameters of the network (e.g., the convolutional neural network (CNN) or fully connection network (FCN)). Where the training is supervised, the differences (e.g., L1, L2, mean square error, or other loss) between the estimated output and the ground truth output are minimized.

The machine-learned reconstruction algorithm may be trained end-to-end including the data consistency operation, so during the training process the machine-learned reconstruction algorithm is not required to learn to reconstruct the low spatial frequencies and may then use all of its capacity to only focus in predicting the high spatial frequencies, i.e., a much simpler task for which less training data are needed to obtain a satisfying generalization. This may increase the accuracy of the reconstruction.

Any architecture or layer structure for machine learning may be used for the network. The architecture of the network defines the structure, learnable parameters, and relationships between parameters. In one embodiment, a convolutional or another neural network is used. Any number of layers and nodes within layers may be used. A DenseNet, U-Net, encoder-decoder, Deep Iterative Down-Up CNN, image-to-image and/or another network may be used. Some of the network may include dense blocks (i.e., multiple layers in sequence outputting to the next layer as well as the final layer in the dense block). Any know known or later developed neural network may be used. Any number of hidden layers may be provided between the input layer and output layer.

In an embodiment, the data consistency operation is performed by a layer at (or near) the end (output) of the network. In the case of a k-space to image reconstruction the input of the network is already in the kspace domain, and the available measurements are the acquired kspace coefficients. In the case of an image-to-image reconstruction, the input of the network needs to be transformed to the k-space domain and a mask indicating the acquired measurements needs to be provided to the network. For example, for a super-resolution task without partial Fourier, the mask corresponds to all the k-space coefficients of the input low-resolution image. If there is partial Fourier, only the acquired measurements will be included in the mask and the mask will be asymmetric. In an embodiment, the norm ball DC projection is implemented using the L2 norm and L∞ norm ball projections for both the image-to-image case and the multicoil kspace to image case. Other Lp norms, with p different from 2 and ∞ may be used instead.

The L2 norm is essentially the sum of squares and the square root. Other norms may be used up to the L∞ norm (the maximum norm). The L∞ norm picks the maximum absolute value that occurs in the vector and returns it as the respective result of the norm. A unit ball is the set of all points that fulfill the property that the norm is lower to one. This then gives rise to the unit ball of that respective norm.

The norm ball DC operation enforces data consistency by adjusting a balance between a reconstruction network prediction and the scan data by based at least in part on the noise level information. The value of the radius r of the norm ball is proportional to the standard deviation of the noise σ, i.e., r=wσ where w can either be set to a fixed valued (e.g., 1) or be a trainable parameter.

Figure 2:
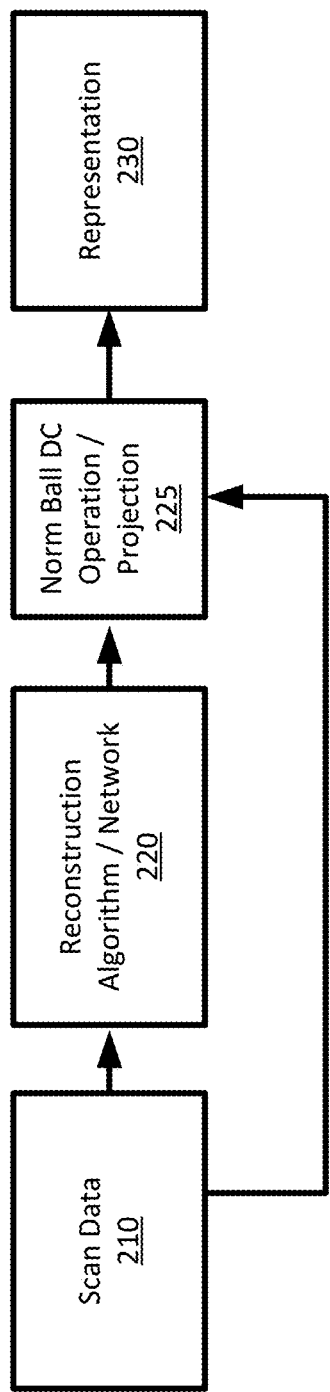
FIG. 2 depicts an example operation of the components of FIG. 1.

FIG. 2 depicts an example operation of the components of FIG. 1. The Medical Imaging System 100 provides scan data 210 of a patient 11. A reconstruction algorithm 220 (also referred to as the reconstruction network 220) generates predicted or estimated data. The norm ball DC operation 225 enforces data consistency between the scan data 210 and the output of the reconstruction algorithm 220 using a norm ball projection. The norm ball DC operation 225 may be part of the reconstruction algorithm 220, for example, implemented at the end as a layer in the reconstruction network 220. The output is a representation 230 of the region or object that was scanned. Other components may be used, such as a remote server or a workstation performing the acquisition of the scan data 210, the reconstruction, and/or the display.

Figure 3:
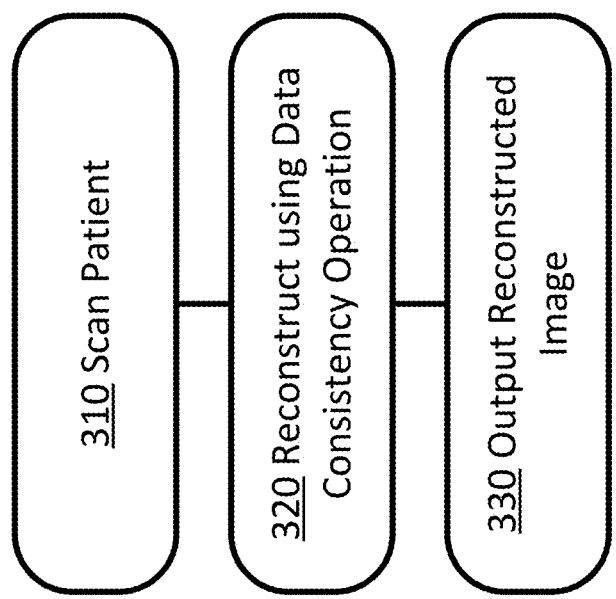
FIG. 3 is a flow chart diagram of one embodiment of a method for reconstruction of a medical image in a medical imaging system.

FIG. 3 is a flow chart diagram of one embodiment of a method for reconstruction of a medical image in a medical imaging system, such as reconstruction of a MR image in an MR system. The method is performed by the system of FIG. 1 or another system. The method is performed in the order shown or other orders. Additional, different, or fewer acts may be provided. For example, preset, default, or user input setting are used to configure the scanning. As another example, the image is stored in a memory (e.g., computerized patient medical record) or transmitted over a computer network instead of or in addition to the display.

In act 310, the medical imaging system 100 scans a patient 11. The scan is guided by a protocol, such as parallel imaging with compressed sensing or another protocol. The pulse or scan sequence scans the region of the patient 11, resulting in scan data 210 for a single imaging appointment. In an MR example, a pulse sequence is created based on the configuration of the MR scanner (e.g., the imaging protocol selected). The pulse sequence is transmitted from coils into the patient 11. The resulting responses are measured by receiving radio frequency signals at the same or different coils. The scanning results in k-space measurements as the scan data 210.

The scan data 210 includes at least some noise. MR images, for example, are sensitive to noise that results from image acquisition errors and transmission errors. One common quantification of noise is the standard deviation in the pixel values within a region of interest with uniform physical properties. The larger the standard deviation, the worse the noise. Signal-to-noise ratio (SNR) is a generic term that is a measure of true signal (i.e., reflecting actual anatomy) to noise (e.g., random quantum mottle). On MRI the signal-to-noise ratio is measured frequently by calculating the difference in signal intensity between the area of interest and the background (for example, chosen from the air surrounding the object).

In act 320, the medical imaging system 100, for example using an image processor 27, generates a reconstructed image from the scan data 210 using a reconstruction network 220 comprising at least a data consistency operation that enforces data consistency by using a norm ball projection that adjusts a balance between a reconstruction network prediction and the scan data 210 by taking into account the noise level information. The object (e.g., anatomy) of the patient 11 that was scanned is reconstructed. The image processor reconstructs a representation 230 or reconstruction from the scan data 210 of the scan. For MR reconstruction, the k-space data is Fourier transformed into scalar values representing different spatial locations, such as spatial locations representing a plane through or volume of a region in the patient 11. Scalar pixel or voxel values are reconstructed as the MR image or object. The spatial distribution of measurements in object or image space is formed. This spatial distribution represents the object of the patient 11.

Various inputs for reconstruction may be used. In an embodiment, the reconstruction uses an iterative process. The scan data 210 is input, such as inputting under-sampled multi-coil k-space data, along with a value or level that is representative of noise in the scan data 210. Coil sensitivity maps and/or an input coil bias field correction map may also be input. The reconstruction is performed using any of various techniques. For example, an optimization is performed to fit the scan data 210 to an estimated representation, such as GRAPPA or other reconstruction algorithm. In embodiments, the reconstruction uses, at least in part, a network trained with deep machine learning. The network is previously trained, and then used as trained in reconstruction. Fixed values of learned parameters are used for application.

The data consistency operation is performed using a norm ball projection. The norm ball DC projection enforces data consistency by using a norm ball projection that adjusts a balance between a reconstruction network prediction and the scan data 210 by taking into account the noise level information.

There are multiple different embodiments for the norm ball DC projection depending on the type of input and networks used in the reconstruction process. Several examples are provided below including an image-to-image reconstruction, a k-space-to-image reconstruction, and an iterative reconstruction. Alternative methods or equations may be used when performing the norm ball DC projection. For example, a L2 or L∞ norm ball is used below, but other norms may be used.

For the case of an image-to-image reconstruction, the norm ball DC projection may be summarized with the following pseudo code: where x is the input of the DC layer and $\hat{x}$ its output, Y is the kspace of the network's input, for example padded in the case of super-resolution so that its size matches the size of the network's output. The mask is a binary matrix of the same size as the output k-space, and with ones in kspace locations where the data was originally acquired and zero otherwise:

X←FFT(x)
X←normball(r, mask, X, Y)
$\hat{x}$←IFFT(X)

The "normball(r, mask, X, Y)" function projects each coefficient $X_i$ of X that has a 1 in the mask ($m_i$=1), to the magnitude ball (L2 ball in the complex plan) of radius r centered on the corresponding coefficient $Y_i$ of:

$$Y, \text{ i.e. } X_i \leftarrow B_{|\cdot|}(X_i, Y_i, r) = (1 - m_i)X_i + Y_i + \frac{r(m_i X_i - Y_i)}{\max\{|m_i X_i - Y_i|, r\}}.$$

When $m_i$=0, $Y_i$=0, there is no need to multiply $Y_i$ with $m_i$.

The value of the radius r is proportional to the standard deviation of the noise σ, i.e., r=wσ. In an embodiment, w can either be set to a fixed valued (e.g., 1) or be a trainable parameter. The network may be trained end to end with w being trainable. Alternatively, w may be trained independently.

When σ=0, then r=0, and $B_{|\cdot|}(X_i, Y_i, 0) = (1-m_i)X_i + Y_i$, which corresponds to the use of the hard DC. When σ→+∞, then r→+∞, $B_{|\cdot|}(X_i, Y_i, r\to+\infty) = X_i$ meaning that this layer behaves like an identity operation.

This approach projects each coefficient to a magnitude ball in the complex domain. It can be seen as an infinity ball (L∞ ball) projection in the sense that the actual set projected to is: $\|MAx-y\|_\infty \le r$, where M is a diagonal matrix, which diagonal elements $m_i$ are the mask coefficients.

In an embodiment, the norm ball DC projection uses the following L2 ball set: $\|MAx-y\|_2 \le r$.

In that case the projection function is:

$$X \leftarrow B_{\|\cdot\|_2}(X, Y, r) = (1 - M)X + Y + \frac{r(MX - Y)}{\max\{\|MX - Y\|_2, r\}}.$$

These two projections (L∞ or L2) are orthogonal projections in the sense that the projected point is the closest in the ball (L∞ or L2) from the initial point.

In the case of a k-space-to-image reconstruction, the norm ball DC projection may be implemented as a sequence of gradient or modified gradient steps. As opposed to the image-to-image reconstruction, multiple iterations ("iterative approach") may be necessary to reach theoretical convergence, however in practice one or few steps may be used. An alternative approach, referred to as a "direct approach" may be used. The direct approach consists in doing a line search such that the projection can be done in one step. The line search has a closed form solution for the L2 ball case if the gradient direction intersects the ball. If the gradient direction doesn't intercept the ball, the step-size of the iterative approach can be used instead.

For the iterative approach and a L∞ ball projection, the forward imaging model (excluding the under sampling step M) may be defined as A=F*S, with F being the Fourier transform and S the coil sensitivity mapping is a Parseval tight frame, i.e. such that $A^*A=S^F^F*S=S^**S=I$, where $A^*=S^**F^*$ is the adjoint operator of A and I is the identity matrix.

For the L∞ ball projection, a solution is determined such that each coefficient of MAx−y are inside a L∞ ball, i.e., $\|MAx-y\|_\infty \le r$. This can be achieved by the following iterations:

$$x \leftarrow A^*((I - M)Ax + y + r(MAx - y) \oslash \max\{|MAx - y|, r\}) =$$
$$x - A^*(MAx - y - r(MAx - y) \oslash \max\{|MAx - y|, r\}) =$$
$$x - A^*((MAx - y) \odot (1 - r \oslash \max\{|MAx - y|, r\})) = x - A^*D(MAx - y)$$

where, y is the measurement k-space which contains zeros where there is no measurement, x is the input of the DC layer (in image space), and M is the binary mask, i.e., a diagonal matrix which contains 1 where there is a measurement (i.e., where corresponding y coefficient is nonzero) and zero otherwise. Ø is the element-wise division and ⊙ the element-wise multiplication and D is a diagonal matrix with diagonal entries $D_{i,i}=(1-r/\max\{|M_{i,i}(Ax)_i-y_i|, r\})$ which values are between 0 and 1.

If the point x, is already inside the L∞ ball (i.e., each Fourier coefficients are inside the magnitude ball) or on the sphere, the matrix D=0 as all its diagonal elements are equal to zero: $D_{i,i}=0$, $\forall i$. If some the Fourier coefficients of x are far away from the ball relatively to the size of the ball, the corresponding diagonal entries of D are close to the value one, and this value decreases as the Fourier coefficients of x get closer to the ball.

For the L2 ball projection, the norm ball DC projection seeks for a solution such that $\|MAx-y\|_2 \leq r$ can be achieved by the following iterations:

$$x \leftarrow A^*\left((I-M)Ax + y + \frac{r(MAx-y)}{\max\{\|MAx-y\|_2, r\}}\right) =$$

$$x - A^*\left(MAx - y - \frac{r(MAx-y)}{\max\{\|MAx-y\|_2, r\}}\right) =$$

$$x - \underbrace{\left(1 - \frac{r}{\max\{\|MAx-y\|_2, r\}}\right)}_{\alpha} A^*(MAx - y)$$

If the point x, is already inside the ball or on the sphere, the adaptive step-size $\alpha=0$. If the point x is far away from the ball relatively to the size of the ball, the step size $\alpha$ is close to the value one, and this value decreases as the point x get closer to the ball.

In the single coil case, the convergence may be achieved in only one step, as in the image-to-image reconstruction explained above, and the projection is orthogonal (i.e., the projected point in the ball is the closest one to the input x).

The direct approach, in most cases, requires only one step but requires one extra forward operator (MA see below) applied to the gradient. In the case where the point x is already inside the L2 ball, there is no need to compute anything. In the case where the point x is not already inside the L2 ball, the direct approach consists in finding the smallest step-size $\alpha$ from the gradient iteration $x_{n+1} \leftarrow x_n - \alpha A^*(MAx_n - y)$, such that the new point $x_{n+1}$ is on the L2 sphere. In other words, the direct solution consists in finding the smallest step size $\alpha$, such that the L2 distance from y is equal to the radius r of the L2 ball:

$$\|y - MAx_{n+1}\|^2 = \|d\|^2 - 2\alpha\|\nabla\|^2 + \alpha^2\|MA\nabla\|^2 = r^2,$$

where $d = y - MAx_n$, and $\nabla = A^*d$

The above equation may also be written as:

$$\frac{\|d\|^2 - r^2}{\|MA\nabla\|^2} - 2\alpha \frac{\|\nabla\|^2}{\|MA\nabla\|^2} + \alpha^2 = 0$$

Taking the smallest root of this quadratic equation if it exists:

$$\hat{\alpha} = \frac{\|\nabla\|^2}{\|MA\nabla\|^2} - \frac{1}{\|MA\nabla\|^2}\sqrt{\frac{\|\nabla\|^4}{\|MA\nabla\|^2} + r^2 - \|d\|^2}$$

There is a possibility that the gradient direction does not intersect the ball. In that case $$\frac{\|\nabla\|^4}{\|MA\nabla\|^2} + r^2 < \|d\|^2,$$

in which case the step-size given by the iterative approach can be selected instead. Similar to the iterative approaches described above, the line search does not give an exact orthogonal projection (i.e., the point on the sphere is not the closest one to the input).

The previous approaches using the L∞ projection extend to the case where the noise standard deviation provided as input is not a global scalar but is different for each k-space coefficient, i.e., a noise map. In that case, r is not a scalar but a vector. In practice, even for the iterative approaches presented above, only one iteration may be used as convergence is very fast and only one step is necessary for the single coil case.

In act 330 of FIG. 3, the medical imaging system 100 displays the image of the object from the output of the reconstruction process. The resulting representation 230 or image is then rendered to a two-dimensional display. A display (e.g., display screen or device) displays the medical image, such as the MR image. The medical image, after or as part of any post processing, is formatted for display on the display. The display presents the image for viewing by the user, radiologist, physician, clinician, and/or patient 11. The image assists in diagnosis, prognosis, and/or therapy.

Figure 4:
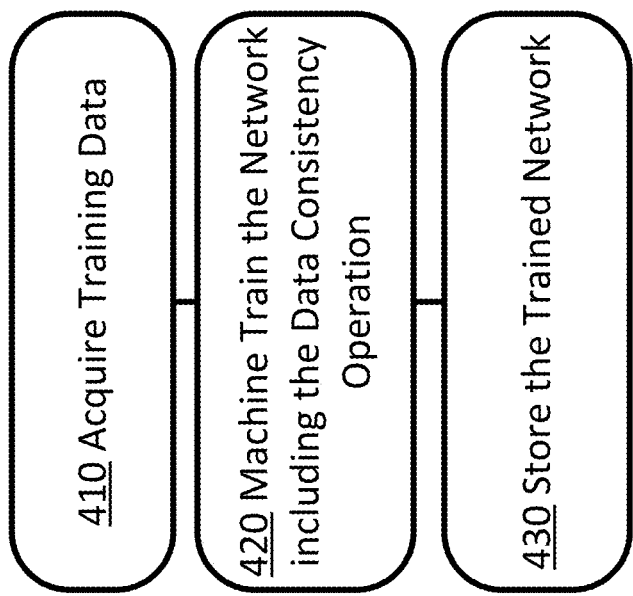
FIG. 4 depicts a flow chart diagram of one embodiment of a method for training a network configured for reconstruction of an image using a medical imaging system.

FIG. 4 depicts a flow chart diagram of one embodiment of a method for training a network 220 configured for reconstruction of a MR image in an MR system. The method is performed by the system of FIG. 1 or another system. The method is performed in the order shown or other orders. Additional, different, or fewer acts may be provided.

At act 410, the system acquires a training set of scan data 210. The training data includes ground truth data or gold standard data, for example verified MR scan data 210 and reconstructed images that have been verified, for example, by operators. Ground truth data and gold standard data is data that includes correct or reasonably accurate labels that are verified manually or by some other accurate method.

At act 420, the reconstruction network(s) 220 is trained using machine for MR reconstruction using the training data to output an image. In an example operation the network 220 inputs the training data and outputs an image. The image is compared to the training data. A loss function may be used to identify the errors from the comparison. The loss function serves as a measurement of how far the current set of predictions are from the corresponding true values. Some examples of loss functions that may be used include Mean-Squared-Error, Root-Mean-Squared-Error, and Cross-entropy loss. Mean Squared Error loss, or MSE for short, is calculated as the average of the squared differences between the predicted and actual values. Root-Mean Squared Error is similarly calculated as the average of the root squared differences between the predicted and actual values. During training and over repeated iterations, the network 220 attempts to minimize the loss function as the result of a lower error between the actual and the predicted values means the network has done a good job in learning. Different optimization algorithms may be used to minimize the loss function, such as, for example, gradient descent, Stochastic gradient descent, Batch gradient descent, Mini-Batch gradient descent, among others. The process of inputting, outputting, comparing, and adjusting is repeated for a predetermined number of iterations with the goal of minimizing the loss function.

In an embodiment, the network 220 is trained end to end including the data consistency operation comprising a norm ball DC projection. The value of the radius r of the norm ball (for the norm ball DC projection) is proportional to the standard deviation of the noise $\sigma$, i.e., $r = w\sigma$ where w is a trainable parameter. w may also be set to a fixed value for the training process and implementation. Alternatively, the data consistency layer may be configured outside the training process.

The norm ball DC projection exploits the information of the standard deviation of the noise, which is included in the available additional information provided by certain MRI scanners. Concretely, a hard DC projection is relaxed by taking into account the level of noise of the k-space measurements. If the noise level is low, the measurements are more reliable than if the noise level is high, and thus a higher weight on the raw measurements can be used when they are merged with the network predictions. With the norm ball projection, if the standard deviation is zero, i.e., there is no noise in the measurements and the norm ball projection behaves identically to the hard DC projection, i.e., the raw measurement is replacing the corresponding coefficients coming from the network. In the other extreme, if the standard deviation is very large, then the norm ball projection just by-passes the signal, i.e., acts as if there was no hard DC layer.

In an embodiment, the norm ball DC projection is implemented by adding a layer at the end of the network 220 which transforms the input of that layer in the k-space domain and projects the coefficients for which there is a corresponding measurement available onto a norm ball centered on that raw measurement coefficient. The radius of that norm ball is proportional to the standard deviation of the noise, and thus if the standard deviation is equal to zero, the norm ball projection is doing exactly the same as the hard DC layer. If the standard deviation is large, then the projection will either do nothing if the network prediction and the raw measurement coefficient are close enough (point inside the ball), or the network coefficient will be pushed toward the measurement coefficient (point outside the ball) until it reaches the ball. After this projection in the k-space domain, the result is transformed back to the image domain using the adjoint operator (Fourier transform and SENSE or RSS).

In the case of a k-space to image reconstruction, the input of the network 220 is already in the kspace domain, and the available measurements are the acquired kspace coefficients. In the case of an image-to-image reconstruction, the input of the network 220 needs to be transformed to the k-space domain and a mask indicating the acquired measurements needs to be provided to the network 220. E.g., for a super-resolution task without partial Fourier, the mask corresponds to all the k-space coefficients of the input low-resolution image. If there is partial Fourier, only the acquired measurements will be included in the mask and the mask will be asymmetric.

The output of the training process is a trained reconstruction network 220 that is ready to be implemented.

At act 430, the reconstruction network(s) 220 is stored for use. The parameters that were optimized or configured during training are saved. One trained, the reconstruction network 220 may be used during a medical imaging procedure. The medical scanner scans the patient 11 and outputs scan data 210. The trained reconstruction network 220 reconstructs a representation 230 using at least a data consistency operation including the norm ball DC operation 225. The norm ball DC operation 225 takes into account the available noise level information in order to automatically adjust the balance between the network prediction and the input measurements. As a consequence, it provides an output with more uniform SNR across data with various input SNR. The representation 230 may be a medical image. A display displays the medical image. Other components may be used, such as a remote server or a workstation performing the acquisition of the scan data 210, the reconstruction, and/or the display. The displayed image may represent a planar region or area in the patient 11. Alternatively, or additionally, the displayed image is a volume or surface rendering from voxels (three-dimensional distribution) to the two-dimensional display.

Although the subject matter has been described in terms of exemplary embodiments, it is not limited thereto. Rather, the appended claims should be construed broadly, to include other variants and embodiments, which can be made by those skilled in the art.

The invention claimed is:

1. A computer implemented method for image reconstruction, the method comprising:
   acquiring scan data defining an input image, wherein the scan data includes noise level information;
   generating a reconstructed image from the scan data using a reconstruction network comprising at least a data consistency operation that enforces data consistency by using a norm ball projection that adjusts a balance between a reconstruction network prediction and the scan data based on at least the noise level information; and
   outputting the reconstructed image.

2. The computer implemented method of claim 1, wherein the noise level information comprises a standard deviation of noise and wherein the norm ball projection uses a norm ball with a radius that is proportional to the standard deviation of noise.

3. The computer implemented method of claim 2, wherein the radius corresponds to a weighting parameter multiplied by the standard deviation of noise.

4. The computer implemented method of claim 3, wherein the weighting parameter is a trainable parameter that is determined during training of the reconstruction network.

5. The computer implemented method of claim 1, wherein the data consistency operation merges, for each one of multiple respective K-space positions, a further respective K-space value provided by the reconstruction network by the respective K-space value associated with the scan data.

6. The computer implemented method of claim 1, wherein the data consistency operation enforces data consistency by transforming an input of a data consistency layer and projects a coefficient for which there is a corresponding measurement available onto a norm ball centered on the coefficient.

7. The computer implemented method of claim 1, wherein the reconstruction network comprises a machine-learned neural network, wherein the machine-learned neural network is trained end-to-end including a data consistency layer that implements the data consistency operation.

8. The computer implemented method of claim 1, wherein the norm ball projection uses an L2 norm ball.

9. The computer implemented method of claim 1, wherein the norm ball projection uses an L∞ norm ball.

10. The computer implemented method of claim 1, wherein the scan data comprises k-space data, wherein the norm ball projection is implemented in a sequence of gradient or modified gradient steps.

11. The computer implemented method of claim 1, wherein the scan data comprises image data, wherein the method further comprises:
    transforming the input image into K-space to obtain a K-space representation of the input image, and wherein K-space values are selected from the K-space representation of the input image within a mask limited to K-space positions natively defined by the scan data.

12. The computer implemented method of claim 1, wherein the reconstruction network comprises an iterative optimization, the iterative optimization comprising multiple iterations, wherein the data consistency operation is executed for each iteration of the multiple iterations.

13. A system for image reconstruction, the system comprising:
   a medical scanner configured to scan a region of a patient, the scan providing scan data including a level of noise for the scan data;
   a reconstruction network comprising a data consistency layer configured to enforce data consistency using a norm ball projection, the reconstruction network configured to output a representation of the scan data; and
   a display configured to display the representation of the scan data.

14. The system of claim 13, wherein the norm ball projection uses a norm ball with a radius that is proportional to a standard deviation of noise of the scan data.

15. The system of claim 14, wherein the radius corresponds to a weighting parameter multiplied by the standard deviation of noise.

16. The system of claim 15, wherein the weighting parameter is a trainable parameter that is determined during training of the reconstruction network.

17. The system of claim 13, wherein the norm ball projection uses a L2 or L∞ norm ball.

18. A method for training a network for image reconstruction, the method comprising:
   acquiring a training set of scan data;
   machine training the network for image reconstruction using the training set of scan data, the network at least comprising a data consistency layer configured to enforce data consistency using a norm ball projection; and
   storing the machine trained network.

19. The method of claim 18, wherein a radius of a norm ball for the norm ball projection is equal to a weighting parameter multiplied by a standard deviation of noise of the scan data.

20. The method of claim 19, wherein the weighting parameter is determined during the machine training of the network.

* * * * *